(12) United States Patent
Voigtlaender et al.

(10) Patent No.: US 12,007,408 B2
(45) Date of Patent: Jun. 11, 2024

(54) METHOD FOR ELECTRICALLY EXAMINING ELECTRONIC COMPONENTS OF AN INTEGRATED CIRCUIT

(71) Applicant: Forschungszentrum Juelich GmbH, Juelich (DE)

(72) Inventors: Bert Voigtlaender, Juelich (DE); Vasily Cheperanov, Juelich (DE)

(73) Assignee: FORSCHUNGSZENTRUM JUELICH GMBH, Juelich (DE)

( * ) Notice: Subject to any disclaimer, the term of this patent is extended or adjusted under 35 U.S.C. 154(b) by 594 days.

(21) Appl. No.: 17/295,052

(22) PCT Filed: Nov. 8, 2019

(86) PCT No.: PCT/DE2019/000295
§ 371 (c)(1),
(2) Date: Jan. 5, 2022

(87) PCT Pub. No.: WO2020/114533
PCT Pub. Date: Jun. 11, 2020

(65) Prior Publication Data
US 2022/0244290 A1 Aug. 4, 2022

(30) Foreign Application Priority Data
Dec. 7, 2018 (DE) ..................... 10 2018 009 623.9

(51) Int. Cl.
*G01Q 30/02* (2010.01)
*H01J 37/28* (2006.01)

(52) U.S. Cl.
CPC .............. *G01Q 30/02* (2013.01); *H01J 37/28* (2013.01)

(58) Field of Classification Search
CPC ......... G01Q 30/02; G01Q 60/30; H01J 37/28; H01J 2237/2583; H01J 2237/2814; H01J 2237/2817
(Continued)

(56) References Cited

U.S. PATENT DOCUMENTS

| 8,536,526 B2 | 9/2013 | Bell et al. |
| 9,115,981 B2 | 8/2015 | Baur et al. |

(Continued)

FOREIGN PATENT DOCUMENTS

| DE | 112014002974 T5 | 6/2016 |
| DE | 102015216673 A1 | 3/2017 |

OTHER PUBLICATIONS

M. Kemmler, et al., "Correlating SEM and SPM for Nanoprobing in Failure Analysis", 2015 IEEE 22$^{nd}$ International Symposium on the Physical and Failure Analysis of Integrated Circuits, Dec. 2015, pp. 227-230, IEEE, Hsinchu, Taiwan.

(Continued)

*Primary Examiner* — Kiet T Nguyen
(74) *Attorney, Agent, or Firm* — LEYDIG, VOIT & MAYER, LTD.

(57) ABSTRACT

A method is provided for electrically examining electronic components of an integrated circuit including a target region to be examined in which electronic components with contact points are located and further including a remaining, non-target region. The method includes performing an examination with a combined SEM/AFM nanoprobe. The examination includes imaging at least a portion of the non-target region with the scanning electron microscope part of the SEM/AFM nanoprobe in a first step, imaging at least a portion of the target region only with the atomic force microscope part of the SEM/AFM nanoprobe in a subsequent step, and recording, in a further subsequent step, (Continued)

current/voltage curves as characteristic electrical curves at the contact points with the nanoprobe, or performing a conductive AFM technique.

10 Claims, 1 Drawing Sheet

(58) Field of Classification Search
USPC .............................................................. 850/9
See application file for complete search history.

(56) References Cited

U.S. PATENT DOCUMENTS

| | | |
|---|---|---|
| 9,891,280 B2 | 2/2018 | Ukraintsev et al. |
| 10,068,747 B2 | 9/2018 | Budach et al. |
| 2011/0180783 A1* | 7/2011 | Gao ................ H01L 31/035227 438/468 |
| 2015/0377921 A1 | 12/2015 | Ukraintsev et al. |

OTHER PUBLICATIONS

S. L. Toh, et al., "In-Depth Electrical Analysis to Reveal the Failure Mechanisms with Nanoprobing", IEEE Transactions on Device and Materials Reliability, Jun. 2008, pp. 387-393, vol. 8, No. 2, IEEE, New York, USA.

M. Gruetzner, "Advanced Electrical Analysis of Embedded Memory Cells using Atomic Force Probing", Microelectronics Reliability, Dec. 2005, pp. 1509-1513, vol. 45, Elsevier, Amsterdam, Netherlands.

S. Doering, et al., "Investigation on the Influence of Focused Electron Beam on Electrical Characteristics of Integrated Devices", Proceedings of the 33$^{rd}$ International Symposium for Testing and Failure Analysis, Nov. 4-8, 2007, pp. 210-213, ResearchGate, Berlin, Germany.

* cited by examiner

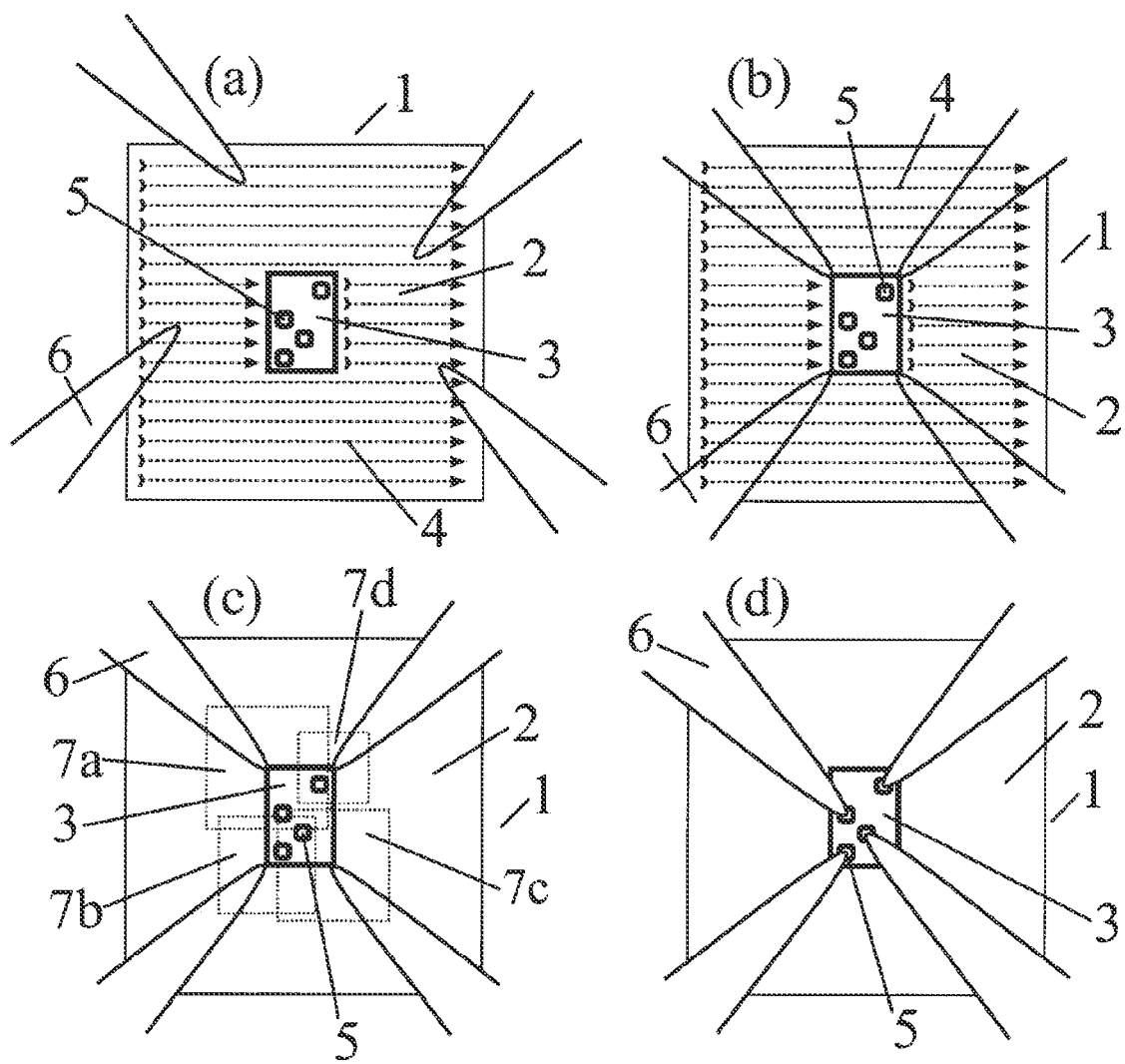

METHOD FOR ELECTRICALLY EXAMINING ELECTRONIC COMPONENTS OF AN INTEGRATED CIRCUIT

CROSS-REFERENCE TO PRIOR APPLICATIONS

This application is a U.S. National Phase Application under 35 U.S.C. § 371 of International Application No. PCT/DE2019/000295, filed on Nov. 8, 2019, and claims benefit to German Patent Application No. DE 10 2018 009 623.9, filed on Dec. 7, 2018. The International Application was published in German on Jun. 11, 2020 as WO 2020/114533 under PCT Article 21(2).

FIELD

The present disclosure relates to a method for electrically examining electronic components of an integrated circuit.

BACKGROUND

In the semiconductor industry and in research institutes, nanoprobes are used in order to electrically characterize integrated circuits in fault analysis and in process optimization. For this purpose, measuring tips are moved directly to the contacts of electronic components of integrated circuits, such as transistor structures, and then the electrical properties of these components are measured, for example on the basis of characteristic curves.

Different types of nanoprobes are thereby used, namely scanning electron microscope-based (SEM) and atomic force microscope-based (AFM) nanoprobes.

Both types of nanoprobes have their specific advantages and disadvantages.

The advantages of an SEM-based nanoprobe are in particular (a) the rapid imaging within a few seconds and (b) the possibility of zooming from the mm range to the nm range, which enables a simple positioning of the measuring tips in relation to the contacts, and (c) the avoidance of lateral leakage currents which can occur to the air given AFM nanoprobes.

The essential advantages of the AFM-based nanoprobe are (a) the contacting of the sample to be measured under force control, which avoids bending or breakage of the tips when placed on insulating points, and (b) a sensitive electrical signal can be detected in parallel with the topography imaging (conductive AFM).

In nanoprobing with an SEM-based nanoprobe, and also with a nanoprobe which combines the SEM and AFM methods, the sample to be examined is imaged with an electron microscope and thus also irradiated with an electron beam. When contacting components or transistor structures with the probe tips of a nanoprobe, their positions in relation to one another and relative to the component to be contacted are observed or monitored via continuous imaging with an SEM. The capability of the scanning electron microscope for rapid imaging and for rapid zooming from the millimeter range across the micrometer range to the nanometer range is thereby utilized. Scanning probe microscopy has a small zoom, thus no millimeter-range imaging, and significantly slower imaging.

It is known that the electrical properties of the components can be damaged by the high-energy electron beam during imaging with the SEM. By way of example, this is described in the publication "Investigation on the Influence of Focused Electron Beam on Electrical Characteristics of Integrated Devices" by S. Doering, R. Harzer, and W. Werner, Qimonda Dresden GmbH & Co OHG, Dresden, Germany, Proceedings of the $33^{rd}$ International Symposium for Testing and Failure Analysis (ISTFA), Volume 33, page 210, Nov. 4-6, 2007, McEnery Convention Center, San Jose, California, USA.

In order to reduce these radiation damages, the beam energies for electron microscope imaging have been reduced more and more in recent years. Presently, beam energies of 500 eV are typically used in SEM imaging. However, radiation damages can still occur even at these low energies. Thus, the problem was not solved but only reduced.

In the patent application U.S. 20150377921 A1, a nanoprobe is described which represents a combination of SEM and AFM nanoprobes.

In the patent U.S. Pat. No. 8,536,526 B2 it is described how, with an SEM-based nanoprobe, a region sensitive to the electron beam is excluded from the irradiation by the electron beam.

In the method described in the patent U.S. Pat. No. 8,536,526 B2, only the outer half of the contacts which are situated just outside the assumed region with the sensitive component structure are irradiated. Thus, half of the contacts appear in the image of the SEM nanoprobe, and the measuring tips can be positioned under monitoring in relation to these contacts. A limitation of the method described in U.S. Pat. No. 8,536,526 B2 for sparing sensitive regions from irradiation by the electron beam is that the contacts via which the sensitive component structure is contacted are often very close to the sensitive component structure that is to be spared from the irradiation by the electron beam. The method described in the document U.S. Pat. No. 8,536,526 B2 for sparing sensitive regions from the irradiation by the electron beam cannot be used generally, because the contacts are often located entirely within the region of the sensitive component structure. In practical application, this leads to sensitive parts of electronic components, such as transistors or diodes, nevertheless being exposed to damage. If this region is spared during imaging with SEM nanoprobes, these contacts are not visible in the SEM image, and the SEM image cannot be used to monitor the position of the tips in relation to the contacts within the region of the sensitive component structure.

SUMMARY

In an embodiment, the present invention provides a method for electrically examining electronic components of an integrated circuit including a target region to be examined in which electronic components with contact points are located and further including a remaining, non-target region. The method includes performing an examination with a combined SEM/AFM nanoprobe. The examination includes imaging at least a portion of the non-target region with the scanning electron microscope part of the SEM/AFM nanoprobe in a first step, imaging at least a portion of the target region only with the atomic force microscope part of the SEM/AFM nanoprobe in a subsequent step, and in a further subsequent step, recording current/voltage curves as characteristic electrical curves at the contact points with the nanoprobe, or performing a conductive AFM technique.

BRIEF DESCRIPTION OF THE DRAWINGS

Embodiments of the present invention will be described in even greater detail below based on the exemplary figures. The present invention is not limited to the exemplary embodiments. The features and advantages of various embodiments will become apparent by reading the following detailed description with reference to the attached drawings which illustrate the following:

FIGS. 1 *a-d*: an integrated circuit on which are depicted trajectories of the electron beam for imaging with the scanning electron microscope as well as the target region and the tips.

DETAILED DESCRIPTION

For application outside of the semiconductor industry, a combination of the two aforementioned types of nanoprobes and their advantages is desirable. It is extremely desirable both to utilize the respective advantages of both methods and to avoid the respective disadvantages.

The present disclosure provides a method for the electrical examination, in particular for the quality control, of electronic components, which method combines the advantages of both methods and devices, wherein the respective disadvantages are to be avoided. In particular, a change in the electrical properties of components by electron beams is to be avoided.

With the method according to the present disclosure, it is now possible to combine the advantages of both technologies and to thereby avoid the respective disadvantages. In particular, damage to the components to be measured by the electron beam is avoided.

In the following, the method is described in its general form, without this being construed as limiting.

According to the present disclosure, components of an integrated circuit can be electrically examined, which integrated circuit possesses a surface on which or under which are located components to be electrically examined which are radiation-sensitive when exposed to electron beams and can be damaged, or which are to be examined in their original condition without exposure to external factors. These regions may contain, for example, components such as capacitors, resistors, transistors, or diodes, and interconnections between them.

The surface region of the integrated circuit in which or below the surface of which the components to be examined are located is called the target region. Located within this target region are then contact points which an enable examination of components, such as capacitors, resistors, transistors, or diodes.

In the most general form, the contact points are points at which an electrical contact to electrical components is established. By way of example, they can thereby be metallic, in particular tungsten, contacts located on the integrated circuit.

The surface of the integrated circuit that is outside of the target region is defined as the non-target region.

According to the present disclosure, the non-target region of the electronic integrated circuit is first imaged at least partially, or also completely, with the scanning electron microscope part of an SEM/AFM nanoprobe. The latter is abbreviated in the following as SEM. The tips of the nanoprobe are moved to the target region.

It is thereby possible to first image regions which are further away from the target region with the scanning electron microscope in order to then approach the positions of the tips toward the outer edge of the target region in small steps. The position of the target region is thereby normally known or approximately known.

The approach toward the target region can thereby take place in different ways.

For example, the SEM may traverse at least a partial area of the electrical non-target region in trajectories, and switch off the electron beam of the SEM when the target region is reached and switch it on again when the non-target region is reached.

It is also possible to guide a continuous electron beam of the SEM in trajectories around the integrated circuit, and to reverse the direction of the electron beam when the target region is reached.

It is also possible to guide the electron beam of the SEM in a spiral shape around the target region. It is thereby possible to first image regions which are further away from the target region with the scanning electron microscope in order to then approach the positions of the tips toward the outer edge of the target region in small steps.

The SEM imaging and the subsequent re-positioning of the tips can thereby preferably be used to guide the tips step by step toward the edge of the target region. The imaging with the SEM is thus performed only outside the target region so that no quality degradation or destruction or an alteration of the components takes place. Components can thus be examined electrically without altering the original state.

The examination with the SEM is thus performed so close to the target region of the electronic component that a quality degradation or destruction or an alteration of the component does not yet take place. This is the case, for example, at a distance of 50 nm to 10 nm from the edge of the target region. Components can be examined without an alteration of the original state occurring.

The imaging of the target region is performed at least partially or entirely only with the atomic force microscope part of the combined SEM/AFM nanoprobe, in order to avoid radiation damage via SEM imaging to the components located on the target region or below the target region. The atomic force microscope part of the combined SEM/AFM nanoprobe is abbreviated as AFM. To perform electrical measurements, the measuring tips are guided, under AFM monitoring of the positions of the tips, toward contact points in the target region in order to perform the electrical measurement thereat with the respective tips.

With the aid of the AFM images of the individual tips, the individual tips can be guided to the desired points, for example to the contact points, and electrical measurements can be performed there. The measurement at the contact points enables an evaluation of the functional components located beneath them, such as capacitors, transistors, resistors, and diodes.

It is also possible that the imaging with AFM includes surface elements of the integrated circuit which belong at least partially to the target region but also at least partially to the non-target region.

According to the present disclosure, the surface region or the surface regions which were identified as a target region are imaged only with the atomic force microscope part of the nanoprobe. The position of the measuring tips, or the distance of the measuring tips from the surface of the integrated circuit, is thereby ascertained by means of the SEM.

In order to perform the electrical examination, (a) the tips are positioned in relation to the contact points under monitoring via AFM imaging, and (b) the tips are lowered at the contact points in order to establish sufficient contact with the contact points for the subsequent electrical measurements, and (c) to then perform the electrical examination.

The characteristic curves are then recorded via the measuring tips. The recording of the characteristic curves can take place over the entire target region or portions thereof.

The recording of characteristic curves includes one or more current/voltage curves which are ascertained either by applying a voltage and measuring currents or by injecting a current and measuring the resulting voltages.

Furthermore, electrical properties of the integrated circuit can also be examined via the conductive AFM technique. The target region should not be irradiated (imaged) with the electron beam, in order to avoid an alteration of the electrical properties of the components of the integrated circuit below the surface and on the surface of the target region, so that it can be examined in its original condition without the effect of external factors.

The method enables an examination, in particular a quality control, of electronic components in integrated circuits while avoiding radiation damage by electron beams, via a combination of both scanning electron microscopic and atomic force microscopic imaging of the sample surface. This applies in particular to the very frequently occurring case in which the contact points to be contacted with the tips are located entirely within the target region.

Shown in FIGURES and the table are comparative details relating to various methods, as well as an electronic component which is examined with the method.

Table 1 below provides a comparison of the advantages of various methods and the method according to the present disclosure.

TABLE 1

| Advantages | SEM | AFM | SEM/AFM |
|---|---|---|---|
| Rapid imaging, zooming from the mm range to the nm range | Yes | No | Yes |
| Avoidance of leakage currents in the air | Yes | No | Yes |
| Sensitive electrical signal during topography imaging | No | Yes | Yes |
| No bending or breakage of tips, imaging with the tip | No | Yes | Yes |
| Avoidance of radiation damage | No | Yes | Yes |

FIGS. 1 a-d illustrate an integrated circuit on which are depicted trajectories of an electron beam for imaging with the scanning electron microscope as well as the target region and the tips.

Shown in FIG. 1a) is a sample in the form of an integrated circuit 1 which is divided into a non-target region 2 and a target region 3. The horizontal dashed lines in the non-target region 2 indicate a trajectory 4 which represents the path along which the electron beam is guided during the scanning electron microscopic imaging in the non-target region 2. Contact points 5 are drawn in the target region 3. In the target region, imaging takes place only with an AFM part of the nanoprobe, the tips of which are identified by reference sign 6.

In FIG. 1b), the same constituents of the sample to be examined have the same reference signs. In it, the tips 6 of the nanoprobe are guided toward the corner points of the target region 3.

FIG. 1c) shows surface elements 7a, 7b, 7c, and 7d which are imaged by the tips 6 of the nanoprobe in the atomic force microscopy mode and which, in addition to partial regions of the target region 3 in which the contact points 5 are located, also comprise regions of the non-target region 2.

FIG. 1d) shows a depiction in which the tips 6 of the nanoprobe are located on the contact points 5.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. Method for electrically examining electronic components of an integrated circuit (1), comprising a target region (3) which is to be examined and in which electronic components with contact points (5) are located, and a remaining region referred to as non-target region (2), characterized in that an examination is performed with a combined SEM/AFM nanoprobe, wherein at least a portion of the non-target region (2) is imaged with the scanning electron microscope part of the SEM/AFM nanoprobe in a first step, and at least a portion of the target region (3) is imaged only with the atomic force microscope part of the SEM/AFM nanoprobe in a subsequent step; and in a further subsequent step, current/voltage curves are recorded as characteristic electrical curves at the contact points with the nanoprobe, or a conductive AFM technique is performed.

2. Method according to claim 1, characterized in that the electronic components of the target region (3) are at least one component from the group of diodes, transistors, resistors, and capacitors.

3. Method according to one of claims 1 to 2, characterized in that the examination of the integrated circuit (1) with the scanning electron microscope part of the SEM/AFM nanoprobe is first performed in regions which are further away from the target region (3), and an electron beam of the scanning electron microscope part of the SEM/AFM nanoprobe is guided toward the target region (3) in small steps.

4. Method according to claim 3,
characterized in that
a portion of the surface of the non-target region is traversed with the scanning electron microscope part of the SEM/AFM nanoprobe in trajectories, and the electron beam of the scanning electron microscope part of the SEM/AFM nanoprobe is switched off when the target region is reached and switched on again when the non-target region is reached.

5. Method according to claim 3,
characterized in that
the electron beam of the scanning electron microscope part of the SEM/AFM nanoprobe is moved in a spiral toward the target region.

6. Method according to claim 3,
characterized in that
a continuous electron beam of the scanning electron microscope part of the SEM/AFM nanoprobe is moved around the integrated circuit in trajectories, and changes direction when it reaches the target region (3).

7. Method according to one of claims 1 to 6,
characterized in that
the imaging of the scanning electron microscope part of the SEM/AFM nanoprobe and a subsequent re-positioning of tips of the atomic force microscope part of the SEM/AFM nanoprobe are used to guide the tips step by step toward the edge of the target region.

8. Method according to one of claims 1 to 7,
characterized in that
the scanning electron microscope part of the SEM/AFM nanoprobe is guided up to a distance of 50 nm to 10 nm from the target region.

9. Method according to one of claims 1 to 8,
characterized in that
surface elements of the non-target region are at least partially examined by the atomic force microscope part of the SEM/AFM nanoprobe.

10. Method according to one of claims 1 to 9,
characterized in that
the target region is completely examined with the atomic force microscope part of the SEM/AFM nanoprobe.

\* \* \* \* \*